United States Patent

[11] 3,617,411

[72] Inventors Roger A. Couture Richmond; John J. Lajza, Jr., Williston; William E. Wright, Shelburne, all of Vt.

[21] Appl. No. 791,043

[22] Filed Jan. 14, 1969

[45] Patented Nov. 2, 1971

[73] Assignee International Business Machines Corporation Armonk, N.Y.

[54] PROCESS FOR ETCHING A PATTERN OF CLOSELY SPACED CONDUCTING LINES IN AN INTEGRATED CIRCUIT

8 Claims, 1 Drawing Fig.

[52] U.S. Cl. .......... 156/8, 96/36, 117/49, 117/213, 117/218, 148/6.2, 156/17, 156/18, 156/22, 156/307, 156/316, 252/79.4, 260/438.5 C

[51] Int. Cl. .......... C23b 3/00, C23f 1/02, C23f 7/26

[50] Field of Search .......... 156/3, 7, 8, 17, 18, 21, 22, 307, 314, 316; 252/79.1, 79.4; 117/49, 54, 213, 215, 218; 148/6.2; 260/438.5; 96/44, 36

[56] References Cited

UNITED STATES PATENTS

| | | | |
|---|---|---|---|
| 2,544,666 | 3/1951 | Goebel et al. | 260/438.5 X |
| 2,544,667 | 3/1951 | Goebel et al. | 260/438.5 X |
| 2,544,668 | 3/1951 | Goebel et al. | 260/438.5 X |
| 2,662,835 | 12/1953 | Reid | 260/438.5 X |
| 2,693,458 | 11/1954 | Olson | 260/438.5 X |
| 2,904,571 | 9/1959 | LaFleur | 260/438.5 X |
| 3,464,820 | 9/1969 | Michalchik | 260/438.5 X |
| 3,466,207 | 9/1969 | Vincent et al. | 252/79.4 X |

*Primary Examiner*—John T. Goolkasian
*Assistant Examiner*—Joseph C. Gil
*Attorneys*—Hanifin and Jancin and Willis E. Higgins

ABSTRACT: Very small patterns may be etched in aluminum or other metal surfaces using photoresist to mask areas of the surfaces where etching is not desired by applying a Werner complex of chromium with a carboxylic acid to the metal surface. The process is particularly useful for etching conducting lines in microminiature semiconductor device fabrication because the chromium complex increases the adhesion of the photoresist to the aluminum sufficiently to improve line resolution in subsequent etching, and does not increase bridging between adjacent conducting lines.

PATENTED NOV 2 1971 3,617,411
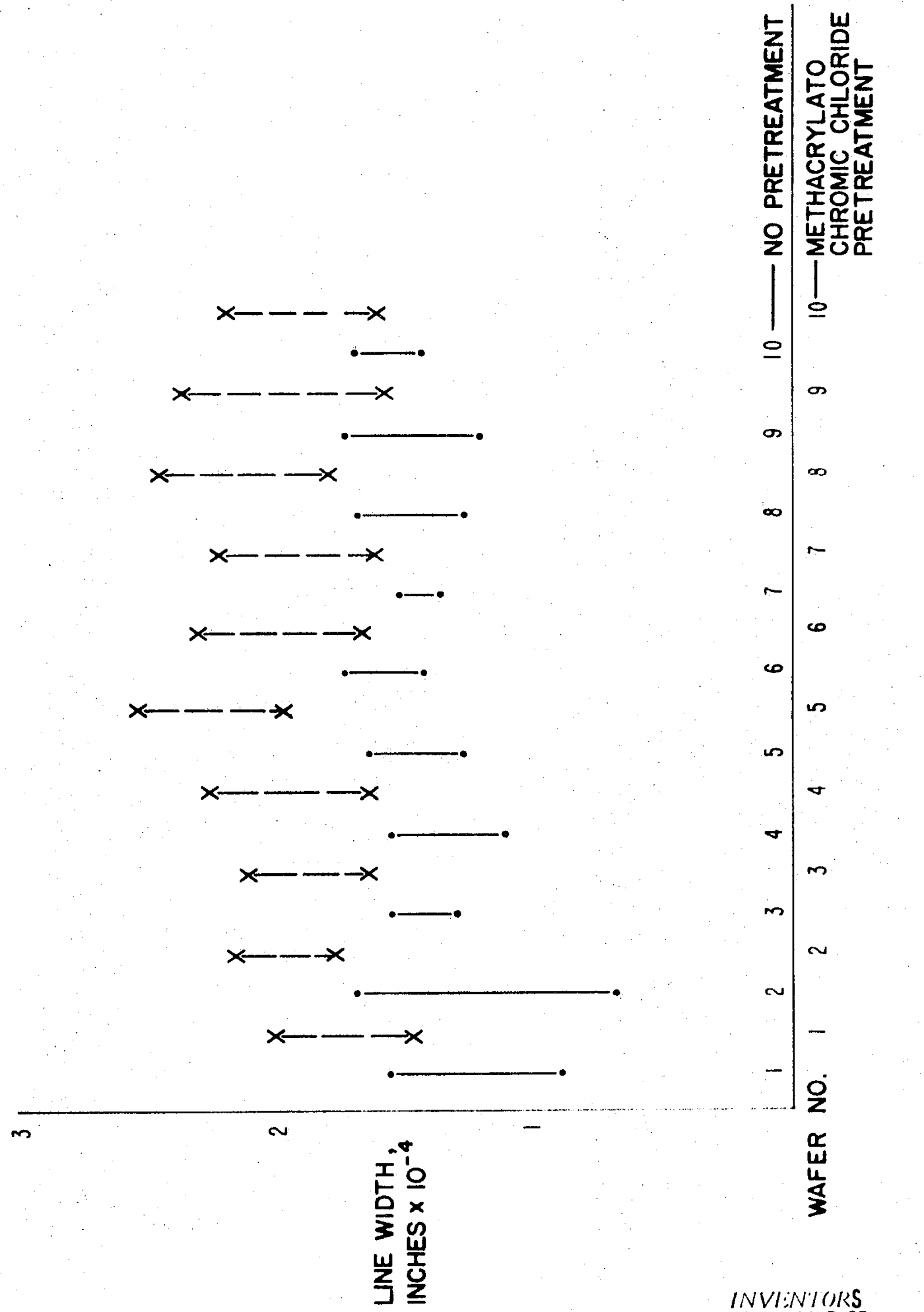
INVENTORS
ROGER A. COUTURE
JOHN J. LAJZA, JR.
WILLIAM E. WRIGHT
BY
Willis E. Higgins
ATTORNEY

PROCESS FOR ETCHING A PATTERN OF CLOSELY SPACED CONDUCTING LINES IN AN INTEGRATED CIRCUIT

FIELD OF THE INVENTION

This invention relates to a process for increasing the adhesion of polymers to metallic substrates. More particularly, it relates to a process for pretreating a metallic surface to increase the adhesion of photoresist to the substrate, thus enabling smaller patterns to be reproducibly etched in the metallic substrate. Most especially, the invention relates to a process for producing metallic conducting lines for microminiaturized semiconductor devices.

THE PRIOR ART

The use of photoresist masking and etching techniques to prepare aluminum conducting lines in microminiaturized semiconductor devices is known. Such a process is described, for example, in Agusta et al., application Ser. No. 539,210, filed Mar. 31, 1966, now U.S. Pat. No. 3,508,209, entitled "-Monolithic Integrated Structure Including Fabrication and Package Therefor," assigned to the same assignee as the present application. In that process, it is desired to form a complex pattern of such conducting lines on the surface of a small chip of silicon (e.g., 0.06×0.06 inches). Each conducting line in the complex pattern has a width from about 0.0003 inches to about 0.001 inches with a spacing between lines of about the same magnitude. The fabrication of these complex patterns has proved to be quite difficult, due on the one hand to undercutting by the etchants into the aluminum covered by the photoresist. Alternatively, incomplete removal of the aluminum between the desired conducting lines causes bridging and short circuits. Therefore, there is a requirement for a process which will increase the adhesion of photoresist to metals from which such conducting lines are to be etched, so that undercutting may be minimized, yet not allow bridging between adjacent conducting lines.

The use of chromic acid and a strong acid, such as nitric acid, to increase the adhesion of polymers to an aluminum surface is disclosed in U.S. Pat. No. 3,321,425 to Sheratte. Such a pretreatment has found wide use for many applications. However, its use in fabricating conducting lines for microminiaturized semiconductor devices is limited, because such acids form metal oxides on the metal surface. Such oxides inhibit etching and cause bridging between the very small, closely spaced conducting lines under the etching conditions employed to make such conducting lines.

SUMMARY OF THE INVENTION

Accordingly, it is an object of the invention to increase the adhesion of polymers to metal surfaces.

It is a further object of the invention to decrease the size of patterns that may be reproducibly etched in a metal surface by increasing the adhesion of photoresist to the metal surface.

It is another object of the invention to decrease the size of patterns that may reproducibly be etched in a metal surface by increasing the adhesion of photoresist to the metal surface, yet not form oxides of the metal on the metal surface from the adhesion increasing process.

It is a further object of the invention to provide a pretreatment for metal surfaces which will increase the width of lines etched from a given pattern in the metal without causing bridging between the lines.

Finally, it is a further object of the invention to provide a pretreatment for metal surfaces of partially fabricated microminiaturized semiconductor devices which will enable such surfaces to be etched into smaller and more complex patterns under large scale manufacturing conditions.

It has been found that these and related objects may be attained by employing a Werner complex of chromium with a carboxylic acid as a treatment for a metal surface in an amount sufficient to increase the adhesion of polymers on the surface. The complex is usually applied in solution form by dipping the metal into the solution or by applying a quantity of such a solution to the surface of the metal, then spinning the metal to spread the solution evenly on the surface.

Suitable Werner complexes for use in the process of this invention desirably have the formula:

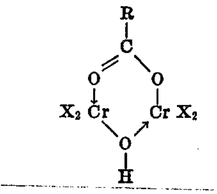

wherein R is a hydrocarbyl or substituted hydrocarbyl group containing from about two to about 30 carbon atoms, and X is a halogen. It is preferred that R either contain a reactive double bond or that it be rather bulky. This may be accomplished by using a Werner complex of an olefinic carboxylic acid containing an activated double bond, e.g., with terminal unsaturation, of a long-chain fatty acid containing, e.g., from 10 to 20 carbon atoms, or of an aromatic carboxylic acid containing, e.g., from six to 20 carbon atoms.

Suitable specific examples of such Werner complexes include the Werner complexes of chromium with alkyl carboxylic acids, such as propionato chromium chloride, in which propionic acid is coordinated with chromium, i-butyrato chromic chloride, in which i-butyric acid is coordinated with chromium, valerato chromic chloride, capryllato chromic chloride, palmitato chromic chloride, stearato chromic chloride, myristato chromic chloride, sebacato chromic chloride; werner complexes of chromium with olefinic carboxylic acids, such as crotonato chromium chloride, i-crotonato chromium chloride, methcrylato chromium chloride, vinylacetato chromic chloride, oleiato chromic chloride, and cinnamato chromic chloride; Werner complexes of chromium with aryl carboxylic acids, such as benzoato chromic chloride or toluato chromic chloride; Werner complexes of chromium with aralkyl carboxylic acids, such as phenylacetato chromic chloride, diphenylacetato chromic chloride; the corresponding fluorides, bromides, and iodides of the Werner complexes named above; and the like. These compounds may be prepared from their respective carboxylic acids by methods known in the art. Solutions of the Werner complexes of chromium with methacrylic, myristic, and stearic acid in isopropyl alcohol are commercially available from the E. I. Du Pont de Nemours & Co., Wilmington Del. The preferred Werner complex is methacrylato chromic chloride.

While applicants do not intend to be bound by any particular theory of operation, it is believed that the chromium ions in the Werner complexes form a loose chemical bond with the metal surface, with the hydrocarbyl or substituted hydrocarbyl groups of the complexes extending above the metal surface. These act to trap a polymer thereafter applied to the metal surface. If the hydrocarbyl or substituted hydrocarbyl or groups of the complex contain an activated double bond, some chemical bonding apparently occurs between the hydrocarbyl or substituted hydrocarbyl group and the polymer chains.

The Werner complexes are preferably applied to the metal surface in the form of dilute solutions in isopropyl alcohol, water, acetone, or other suitable solvent. Solutions containing at least about 0.02 weight percent of the Werner complex are suitable. Preferably, the solutions should contain from about 0.02 to about 7 weight percent of the complex. In the case of the preferred methacrylato chromic chloride complex, best results are obtained with from about 0.2 to 4 weight percent of the complex in predominantly isopropyl alcohol, with about 0.7 weight percent of this complex being especially preferred.

The complex need contact the metal surface only a short time, e.g., 30 seconds or less in order to have the desired effect of increasing the adhesion of the polymers. The complex is preferably applied prior to application of the polymers. No particular advantage is gained by longer contact times. The application of the complex may be carried out at temperatures from about 0° to 100° C. No particular advantage is gained by employing temperatures other than room temperatures, i.e., about 25° C. The complex need only be applied as a thin layer, with monomolecular thicknesses being sufficient.

The process of this invention may be used to increase the adhesion of a wide variety of polymeric adhesives and organic films, such as vinyls, acrylics, alkyds, urethanes, epoxies, and the like. It is particularly suited for increasing the adhesion of photoresist coatings. Among those resists found to be especially suitable include the compositions based on polyvinyl cinnamate, polyisoprene, natural rubber resins, formaldehyde novolaks, cinnamylidene or polyacrylic esters, and the like. Examples of these photoresists include commercially available KPR–2, a polyvinyl cinnamate, based composition having a molecular weight of from 14,000 to 115,000; KTFR, a partially cyclized polymer of cis-1,4-isoprene having an average molecular weight of from 60,000 to 70,000 a natural rubber resin based composition; Shipley AZ–1350, an m-cresol formaldehyde novolak resin composition and KOR, a cinnamylidene or poly-β-styril acrylic ester coating composition. These photoresists normally contain small amounts of a photoinitiator or a photosensitizer which decomposes under the action of ultraviolet light to yield a free radical species which initiates the polymerization reaction. Especially suitable photoinitiators, well known in the art, include the azides, such as 2,6-bis(p-azidobenylidene)-4-methylcyclohexane, the diazo oxides, such as 1-oxo-2-diazo-5-sulfonate ester of naphthalene and the thioazo compounds, such as 1-methyl-2-m-chlorobenzoylmethylene-β-naphtho-thiazoline, as disclosed in U.S. Pat. No. 2,732,301. The thickness of the photoresist to be applied depends upon the particular photoresist used and upon the particular technique and purpose for applying the photoresist. Normally, thicknesses between 8,000 and 20,000 A. are adequate.

While the process has been found particularly valuable for increasing the adhesion of polymers to aluminum, it may be used for a wide variety of other metals, such as copper, molybdenum, nickel, iron, gold, magnesium, platinum, silver, steel, titanium, zinc, alloys of these metals, and the like.

The process of this invention is especially suited for use before applying photoresist to a metallic surface on a partially fabricated microelectronic semiconductor device to etch conducting lines from the metal surface. When a mask is used to expose a given pattern of photoresist on such a metal surface, it is found that the use of a Werner complex of chromium with a carboxylic acid reduces undercutting into the photoresist-covered portion of the metal surface, thus enabling wide conductive lines to be etched with a given pattern of photoresist. At the same time, bridging between adjacent conducting lines is avoided. The net result is that it is possible to produce highly reliable metallic thin film interconnections on the surface of microelectronic semiconductor devices with high production yields. However, the ability to produce smaller and more precise patterns makes the present invention of value for producing essentially any pattern on essentially any metallic substrate.

The foregoing and other objects, features, and advantages of the invention will be apparent from the following more particular description of the preferred embodiments of the invention.

BRIEF DESCRIPTION OF THE DRAWING

The sole figure is a graph which shows the improvement in line width that may be obtained through use of the invention.

DESCRIPTION OF THE PREFERRED EMBODIMENTS

The following nonlimiting examples describe preferred embodiments of the present invention:

EXAMPLE I

A batch of 20 silicon semiconductor wafers are coated with a layer of aluminum of 0.000080-inches thickness in a vacuum evaporator. Ten of these wafers are treated with a solution containing 0.7 weight percent of methacrylato chromic chloride in isopropyl alcohol containing small amounts of acetone and water, prior to photoresist application. The remaining 10 wafers are coated with photoresist without pretreatment. The first group of 10 wafers is dipped in the methacrylato chromic chloride solution for 30 seconds, then allowed to spin dry for 30 seconds. These wafers are heated at 130° C. in an oven for 15 minutes to remove solvents. From this point, all of the wafers are processed identically. The wafers are coated with KTFR photoresist, a partially cyclized poly-cis-isoprene having a number average molecular weight of 46,000 and a weight average molecular weight of 141,000, as determined by gel permeation chromatography, and sensitized to light with 2,6-bis(p-azidobenzylidene)-4-methylcyclohexane, obtained from the Eastman Kodak Company, Rochester, N.Y. The photoresist is diluted with xylene to give a solution containing about 15 weight percent of the photoresist in predominantly xylene. The photoresist is applied to the surface of the wafers, then spun for 30 seconds at 3,600 r.p.m. to allow even spreading and drying. After curing in an oven at 130° C. for 15 minutes, the photoresist-covered wafers are exposed for 2 seconds to ultraviolet light through a 0.6 Neutral Density Filter through a mask having patterns of conducting lines with a line width of 0.0003 inches for microelectronic semiconductor devices. The exposed photoresist is developed according to conventional techniques, then postbaked for 1 hour at 180° C. to harden the remaining photoresist pattern overlying the aluminum which is to form the conducting lines.

The wafers are then etched at 45° C. in an etching solution consisting of 100 parts of reagent grade phosphoric nitric acid, and four parts reagent grade acetic acid, six parts reagent grade nitric acid, and 4 parts water, all by volume until visual examination shows removal of the aluminum from the areas of the wafer not covered with the photoresist, i.e., for 7 minutes for the untreated wafers and 8 minutes for the methacrylato chromic chloride treated wafers. The longer etching times for the treated wafers indicate a slight passivation of the aluminum surface by the chromium complex.

The resulting line widths are measured in three places for each wafer. The drawing shows the minimum and maximum line widths obtained for each wafer. Each bar on the graph connects maximum and minimum line widths measured on the wafer indicated. An average line width of 0.00019 inch is obtained for the 10 wafers pretreated with the methacrylato chromic chloride, compared with an average line width of 0.00013 inch for the untreated wafers. The difference between these line widths and the widths of 0.0003 inch in the photoresist pattern represents the amount of undercutting by the etchant into the photoresist-covered aluminum. The drawing shows a consistent improvement in line width for the 10 wafers pretreated with methacrylato chromic chloride compared to the corresponding untreated wafers.

Microscopic examination of the wafers treated with methacrylato chromic chloride shows essentially no bridging between adjacent conducting lines, despite the greater line widths obtained with the methacrylato chromic chloride pretreatment. Some bridging is observed on the untreated wafers. The methacrylato chromic chloride treated wafers have very straight edges on the lines, while the edges on the untreated wafers are very ragged.

Substitution of myristato chromic chloride or stearato chromic chloride in equivalent amounts in the above procedure gives similar results.

EXAMPLE II

Lots of 10 semiconductor wafers each having vacuum-evaporated aluminum coatings of 0.000080-inch thickness are pretreated with methacrylato chromic chloride and with a chromic acid-nitric acid solution for comparison. The wafers are first dipped in reagent grade ammonium hydroxide solution for 1 minute at 25° C. and in deionized water for 1 minute at 25° C. to clean their surfaces thoroughly. Ten wafers are dipped in a 0.7 percent by weight solution of methacrylato chromic chloride in predominantly isopropyl alcohol for 1 minute. Comparative lots of 10 wafers each are dipped into a saturated solution of chromium trioxide in reagent grade nitric acid, i.e., about one part by volume of chromium trioxide in one part by volume reagent grade nitric acid for times ranging from 30 seconds to 5 minutes, All the wafers are then rinsed with deionized water and methyl alcohol, then dryed in a nitrogen oven for 15 minutes at 180° C.

Photoresist application, exposure and development, and etching are then carried out as in example I. Etching of the chromic acid-nitric acid treated wafers takes several minutes longer than etching of the methacrylato chromic chloride treated wafers, due to the formation of passivating oxides on the surface of the aluminum from the chromic acid-nitric acid treatment. The wafers pretreated with the chromic acid-nitric acid solution show an average line width of about 0.00025 inch, but exhibit a high degree of bridging between adjacent aluminum lines under all treating conditions. The wafers pretreated with methacrylato chromic chloride have an average line width of from 0.00020 to 0.00025 inch and show no bridging.

Substitution of myristato chromic chloride and stearato chromic chloride in equivalent amounts gives similar results.

EXAMPLE III

The procedure of example I was repeated, but with solutions containing 0.024, 0.24, 1.2, and 7.1 percent, all by weight of methacrylato chromic chloride in predominantly isopropyl alcohol. Improvements of from about 50 to 100 percent in line width over untreated aluminum surfaces on semiconductor wafers are observed. With the solution of 7.1 percent methacrylato chromic chloride, some bridging occurs, but it is not as severe as observed with the chromic acid-nitric acid pretreatment in example II.

The procedure of the above examples can be used for other metals, such as copper, nickel, tin, gold, and the like.

While the invention has been particularly shown and described with reference to the preferred embodiments thereof, it will be understood by those skilled in the art that various changes in form and detail may be made therein without departing from the spirit and scope of the invention.

What is claimed is:

1. A process for etching a pattern of closely spaced conducting lines in an integrated circuit comprising:
   a. depositing a metallic film on an insulating layer carried by a semiconductor wafer having a plurality of integrated semiconductor devices in the wafer and contact holes through said insulating layer to said semiconductor devices,
   b. applying a sufficient amount to increase the adhesion of a photoresist to the metallic film of a solution consisting essentially of a Werner complex of chromium with a carboxylic acid and a suitable solvent to the metallic film surface,
   c. applying a photoresist-masking layer to portions of the so-treated metallic film in a pattern corresponding to the desired closely spaced conducting lines, and
   d. etching away the portions of the metallic film free of said photoresist-masking layer down to said insulatng layer.
2. The method of claim 1 in which the metal is aluminum.
3. The method of claim 1 in which the Werner complex has the formula:

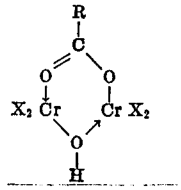

wherein R is a hydrocarbyl or substituted hydrocarbyl group containing from about two to about 30 carbon atoms, and X is a halogen.

4. The method of claim 3 in which the complex is applied in a solution containing from about 0.02 to about 7 weight percent of the complex.
5. The method of claim 4 in which X is chlorine.
6. The method of claim 4 in which the Werner complex is of an olefinic carboxylic acid.
7. The method of claim 6 in which X is chlorine.
8. The process of claim 6 in which the olefinic carboxylic acid is methacrylic acid, X is chlorine, and the complex is applied in a solution containing about 0.02 to about 4 weight percent of the complex.

* * * * *